United States Patent [19]

Higashino et al.

[11] Patent Number: 5,142,223

[45] Date of Patent: Aug. 25, 1992

[54] DEVICE FOR TESTING SEMICONDUCTOR DEVICE

[75] Inventors: Naomi Higashino; Ryuji Omura, both of Itami, Japan

[73] Assignee: Mitsubishi Denki Kabushiki Kaisha, Tokyo, Japan

[21] Appl. No.: 664,842

[22] Filed: Mar. 5, 1991

[30] Foreign Application Priority Data

Mar. 20, 1990 [JP] Japan .................................. 2-71368

[51] Int. Cl.$^5$ ............................................ G01R 31/28
[52] U.S. Cl. ............................... 324/158 R; 371/22.1
[58] Field of Search ...................... 324/158 R, 73.1; 371/22.1, 22.3, 22.6, 25.1

[56] References Cited

U.S. PATENT DOCUMENTS 3,622,876 11/1971 Ure et al. ......................... 371/22.6
4,945,536 7/1990 Hancu ............................. 371/22.3
4,989,209 1/1991 Littebury et al. ................ 371/25.1

Primary Examiner—Ernest F. Karlsen
Attorney, Agent, or Firm—Oblon, Spivak, McClelland, Maier & Neustadt

[57] ABSTRACT

A testing device comprises a plurality of pin test portions, each of which is separately provided with a pin pattern controller for controlling the readout of pattern and timing data from pattern and timing memories and a pin instruction memory for storing programs defining the operation procedure of the pin pattern controller. Therefore, the data to be stored in the pattern and timing memories in each of the pin test portions can be in a compressed form, independently of the data to be stored in the pattern and timing memories in the other pin test portions.

8 Claims, 4 Drawing Sheets ns of the invention

DEVICE FOR TESTING SEMICONDUCTOR DEVICE

BACKGROUND OF THE INVENTION

1. Field of the Invention

The present invention relates to a device for testing a semiconductor device and more particularly to an improvement for generating a test signal with a small-scale structure.

2. Description of the Background Art

FIG. 3 is a block diagram showing a conventional device for testing a semiconductor device. In FIG. 3, numeral 1 designates a CPU for controlling each section in the test device 100. A command from the CPU 1 is transmitted through a CPU bus 2 to each section in the test device 100. The test device 100 is provided with a plurality of external signal terminals 3a, 3b, . . . 3n, which are connected to each pin of a semiconductor device 200 to be tested.

Pin test portions 4a, 4b, . . . 4n are provided correspondingly to the external signal terminals 3a, 3b, . . . 3n, respectively. Each of the pin test portions 4a, 4b, . . . 4n is composed of a pattern memory 5, a timing memory 6, a timing generator 7, an output waveform generation circuit 8 and a comparator 9. The pattern memory 5 stores data on logical patterns of a test signal for the corresponding pins of the semiconductor device 200 to be tested and data on logical patterns of judgement. The timing memory 6 stores data on timings in which the test signal is applied and data on timings of judgement. The timing generator 7 generates a timing signal TM on the basis of data which is read out from the timing memory 6. The output waveform generation circuit 8 generates an output waveform on the basis of pattern data PT which is read out from the pattern memory 5 and the timing signal TM and outputs it as a test signal TS to the corresponding external siganl terminal 3a, 3b, . . . 3n. The comparator 9 samples a response output from the semiconductor device 200 to be tested in the timing of the timing signal TM outputted from the timing generator 7 to make a judgement by comparing the sampled data with the pattern data PT outputted from the pattern memory 5.

The test device 100 is provided with a pattern controller 10, an instruction memory 11, a period memory 12 and a test synchronizing signal generator 13, which are common to each of the pin test portions 4a, 4b, . . . 4n. The pattern controller 10 controls the sequences of generating the test signal and executing the judgement in each of the pin test portions 4a, 4b, . . . 4n, and others. The instruction memory 11 stores programs which specify an operation process of the pattern controller 10. The period memory 12 stores period data which specify a period of a test synchronizing signal SY for synchronizing each of the pin test portions 4a, 4b, . . . 4n with each other. The test synchronizing signal generator 13 generates the test synchronizing signal SY in accordance with the period data being read out from the period memory 12.

Next, an operation of the device is explained, referring to FIG. 4. A test program produced by the CPU 1 is transmitted through the CPU bus 2 to the pattern memories 5, the timing memories 6, the instruction memory 11 and the period memory 12 to be stored therein. Normally, the contents of the pattern memories 5 have a value "0" or "1", those of the timing memories 6 have a value indicating an address of a timing edge data table 7a in the timing generator 7, and those of the period memory 12 have a value indicating an address of a test synchronizing signal timing data table 13a in the test synchronizing signal generator 13, as shown in FIG. 4.

When a test start command is supplied by the CPU 1 to the pattern controller 10, the pattern controller 10 transmits a start address to the pattern memories 5, the timing memories 6, the instruction memory 11 and the period memory 12. Subsequently, addresses determined in accordance with the contents of the instruction memory 11 are transmitted to the memories 5, 6, 11 and 12. The contents of the respective memories 5, 6, 11 and 12 are read out in series according to the supplied addresses.

The data which is read out from the period memory 12 is supplied to the test synchronizing signal generator 13. The test synchronizing signal generator 13 accesses the test synchronizing signal timing data table 13a in accordance with the supplied data (or the address value) to determine the period of the test synchronizing signal SY to be generated. The test synchronizing signal SY with the determined period is generated in the test synchronizing signal generator 13 and is supplied to the pattern memories 5, the timing memories 6, the timing generators 7 and the pattern controller 10.

The data which is read out from the timing memory 6 is supplied to the timing generator 7. The timing generator 7 accesses the timing edge data table 7a in accordance with the supplied data (or the address value) to determine the timing of the test signal TS to be generated (and the timing of executing the judgment not shown in FIG. 4). The timing signal (or set edge and reset edge signals in FIG. 4) TM with the determined timing is generated in the timing generator 7 and is supplied to the output waveform generation circuit 8 and the comparator 9.

The pattern data PT which is read out from the pattern memory 5 is supplied to the output waveform generation circuit 8 and the comparator 9. The output waveform generation circuit 8 generates an output waveform in accordance with the supplied pattern data PT and timing signal TM and outputs it as a test signal TS to the corresponding external signal terminal 3a, 3b, . . . 3n. On the other hand, though not shown in FIG. 4, the comparator 9 samples the response output from the semiconductor device 200 to be tested in the timing of the timing signal TM outputted from the timing generator 7 to make a judgment by comparing the sampled data with the pattern data PT outputted from the pattern memory 5.

In addition, algorithms of generating addresses in the pattern controller 10 are programmed by instructions in the instruction memory 11. Since the addresses of the pattern memories 5 and the timing memories 6 are communicable between all of the pin test portions 4a, 4b, . . . 4n, the algorithms of generating the test signal and executing the judgment in each of the pin test portion 4a, 4b, . . . 4n can be controlled by only one pattern controller 10 and one instruction memory 11.

According to the conventional device for testing the semiconductor device as constructed above, the addresses to the pattern memories 5 and the timing memories 6 in each of the pin test portions 4a, 4b, . . . 4n are constantly common. Therefore, also a pin test portion in which the frequencies of waveform change of the test signal TS and judgment execution are low is required to ensure the same number of addresses of the pattern memory 5 and the timing memory 6 if the waveform change of the test signal or the judgment execution occurs in other pin test portions. In FIG. 4, for example, the contents of the pattern memory 5 and timing memory 6 in the pin test portion 4b do not change for first five addresses. However, the contents of the pattern memory 5 and timing memory 6 in the pin test portion 4a change for each address. Accordingly, it is necessary for the pattern memory 5 and timing memory 6 in the pin test portion 4b to ensure the capacity for five addresses.

As a result, the capacity of all pattern memories 5 and timing memories 6 grows enormous. Furthermore, the increase in memory capacity is accompanied by an increase in the power dissipated by the test device and the enlargement of the external dimension thereof, and test programs grow so large that they are difficult to manage.

SUMMARY OF THE INVENTION

According to the present invention, a device for testing a semiconductor device comprises a plurality of external signal terminals to be connected to pins of the semiconductor device to be tested and a plurality of pin test portions provided correspondingly to the external signal terminals, respectively each of the pin test portions comprising first storing means for storing first data on logical patterns of a test signal to be applied through a corresponding on of the external signal terminals to a corresponding one of the pins to which the external signal terminal is connected, second storing means for storing second data on timings in which the test signal is applied, control means for controlling readout of the first and second data from the first and second storing means, third storing means for storing programs which specify an operation process of the control means, and signal generating means for generating the test signal on the basis of the first and second data which are read out from the first and second storing means to apply it to a corresponding one of the external signal terminals.

According to the present invention, each of the plurality of pin test portions is separably provided with the control means for controlling the readout of the first and second data from the first and second storing means and the third storing means for storing programs which define an operation procedure of the control means. Therefore, the data to be stored in the first and second storing means in each of the pin test portions can be in a compressed form, independently of the data to be stored in the first and second storing means in the other pin test portions. As a result, in addition to the memory capacity in each of the pin test portions being small, the test device can be small-sized and the power dissipated therein is lowered. Furthermore, the volume of the test programs is reduced so that the test programs can be produced and managed easily.

Accordingly, it is an object of the present invention to provide a device for testing a semiconductor device, in which the memory capacity in each of the pin test portions is small.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
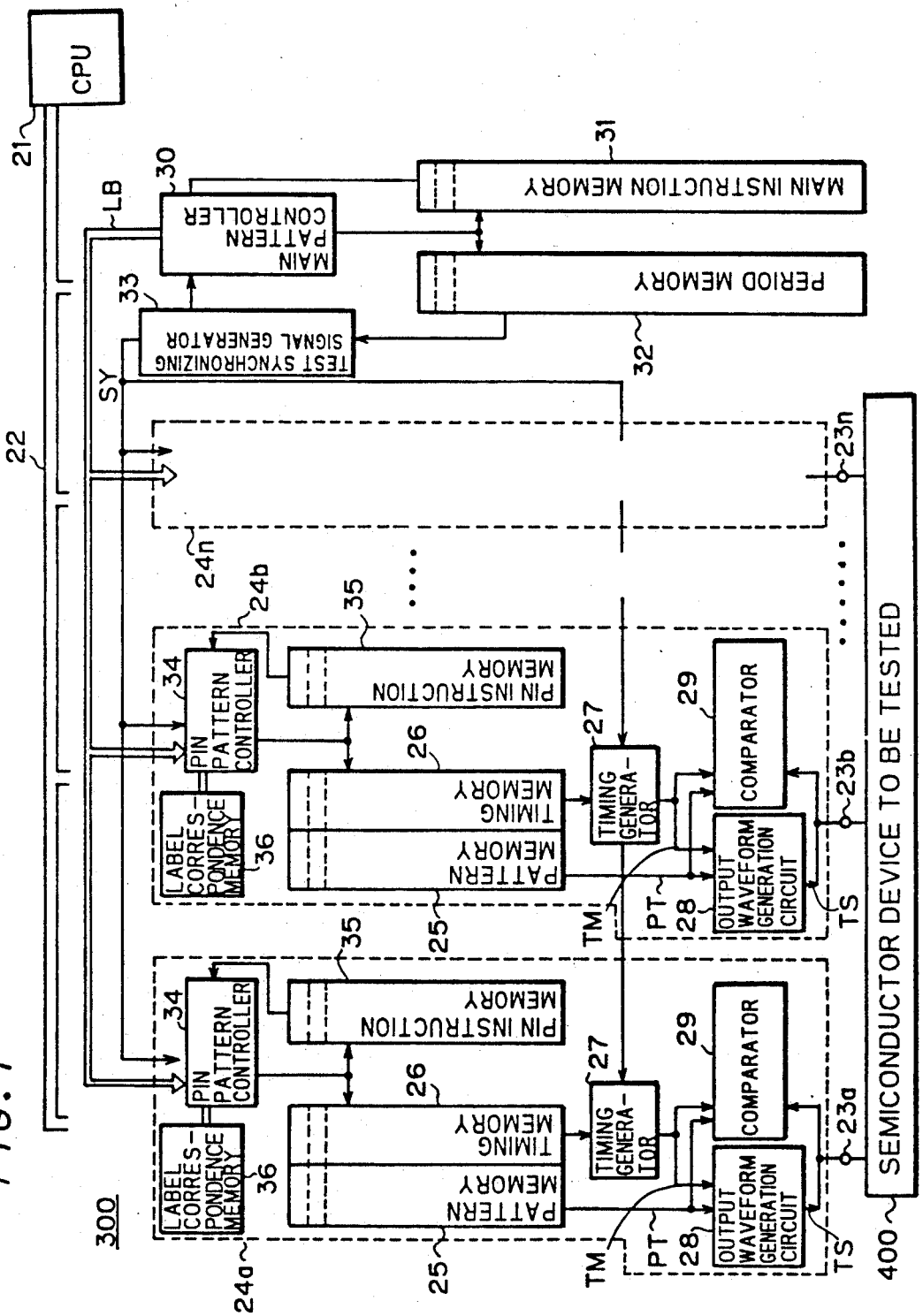
FIG. 1 is a block diagram showing one embodiment of a device for testing a semiconductor device according to the present invention.

FIG. 1 is a block diagram showing one preferred embodiment of a device for testing a semiconductor device according to the present invention. In FIG. 1, numeral 21 designates a CPU for controlling each section in the test device 300. A command from the CPU 21 is transmitted through a CPU bus 22 to each section in the test device 300. The test device 300 is provided with a plurality of external signal terminals 23a, 23b, . . . 23n, which connected to each pin of a semiconductor device 400 to be tested.

Figure 3:
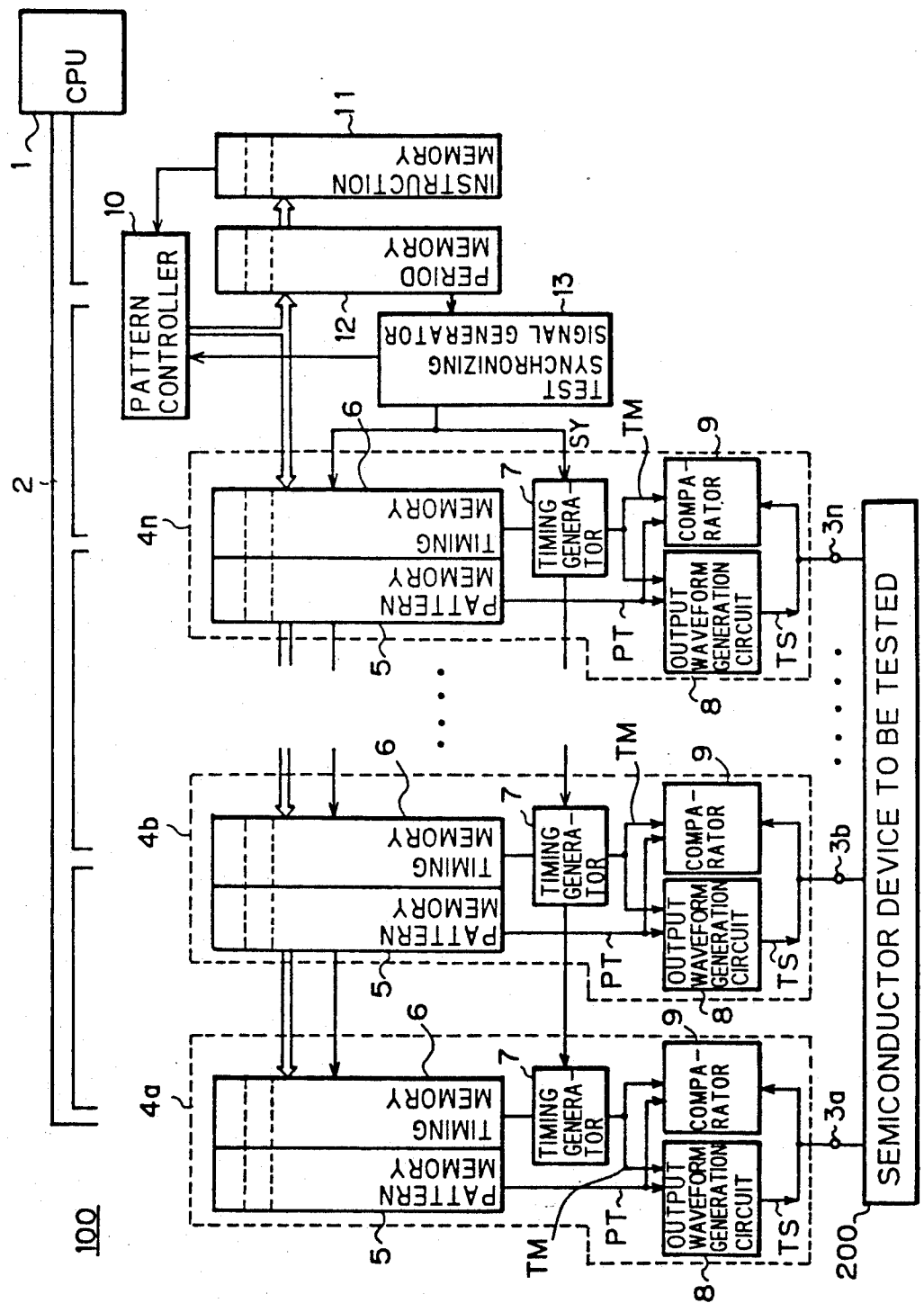
FIG. 3 is a block diagram showing a conventional device for testing a semiconductor device.

Pin test portions 24a, 24b, . . . 24n are provided correspondingly to the external signal terminals 23a, 23b, . . . 23n, respectively. Each of the pin test portions 24a, 24b, . . . 24n is provided with a pattern memory 25, a timing memory 26, a timing generator 27, an output waveform generation circuit 28 and a comparator 29, which are similar to those in each of the pin test portions 4a, 4b, . . . 4n of the conventional test device 100 shown in FIG. 3. Each of them is additionally provided with a pin pattern controller 34, a pin instruction memory 35 and a label correspondence memory 36.

The pattern memory 25 stores data on logical patterns of a test signal for the corresponding pins of the semiconductor device 400 to be tested and data on logical patterns of judgment. The timing memory 26 stores data on timings in which the test signal is applied and data on timings of performing the judgment. In each of the pin test portions 24a, 24b, . . . 24n, readout of the data from the pattern memory 25 and the timing memory 26 is controlled by the pin pattern controller 34 in the same pin test portion. The pin instruction memory 35 stores programs which specify an operation process of the corresponding pin pattern controller 34. The label correspondence memory 36 stores tables indicating the correspondence between contents of label data LB outputted from a main pattern controller 30 and specific addresses of the pin instruction memory 35.

The timing generator 27 generates a timing signal TM on the basis of data which is read out from the timing memory 26. The output waveform generation circuit 28 generates an output waveform on the basis of pattern data PT which is read out from the pattern memory 25 and the timing signal TM and outputs it as a test signal TS to the corresponding external signal terminal 23a, 23b, . . . 23n. The outputted test signal is inputted to the semiconductor device 400 to be tested through the pin thereof which are connected to the corresponding external signal terminal 23a, 23b, . . . 23n. A response output from the semiconductor device 400 to be tested is inputted to the comparator 29 through the external signal terminal 23a, 23b, . . . 23n. The comparator 29 samples the response output in the timing of the timing signal TM outputted from the timing generator 27 to make a judgment by comparing the sampled data with the pattern data PT outputted from the pattern memory 25.

The test device 300 according to the preferred embodiment is provided with a main pattern controller 30, a main instruction memory 31, a period memory 32 and a test synchronizing signal generator 33, which are common to each of the pin test portions 24a, 24b, ... 24n. The main pattern controller 30 controls functions in relation to all of the pin test portions 24a, 24b, ... 24n, e.g., control of the sequences of generating the test signal and executing the judgment in all of the pin test portions 24a, 24b, ... 24n, control of the periods of a test synchronizing signal SY which is common to all of the pin test portions 24a, 24b, ... 24n and voltage changes of the test signal TS outputted from all of the pin test portions 24a, 24b, ... 24n. The main instruction memory 31 stores programs which specify an operation process of the main pattern controller 30.

In the case where a main instruction of an address is related to the control common to all of the pin test portions 24a, 24b, ... 24n, such as an instruction related to the sequence of generating the test signal in all of the pin test portions 24a, 24b, ... 24n, the main instruction is labelled. The main pattern controller 30 transmits label data LB to the pin pattern controllers 34 in each of the pin test portions 24a, 24b, ... 24n, when the main instruction is executed. Each of the pin pattern controllers 34, by accessing the label correspondence memory 36, obtains the address corresponding to the transmitted label data LB and uses it as a designation address to the next pattern memory 25, timing memory 26 and pin instruction memory 35.

The period memory 32 stores period data which specify a period of the test synchronizing signal SY for synchronizing each of the pin test portions 24a, 24b, .. . 24n with each other. The test synchronizing signal generator 33 generates the test synchronizing signal SY in accordance with the period data being read out from the period memory 32.

Figure 2:
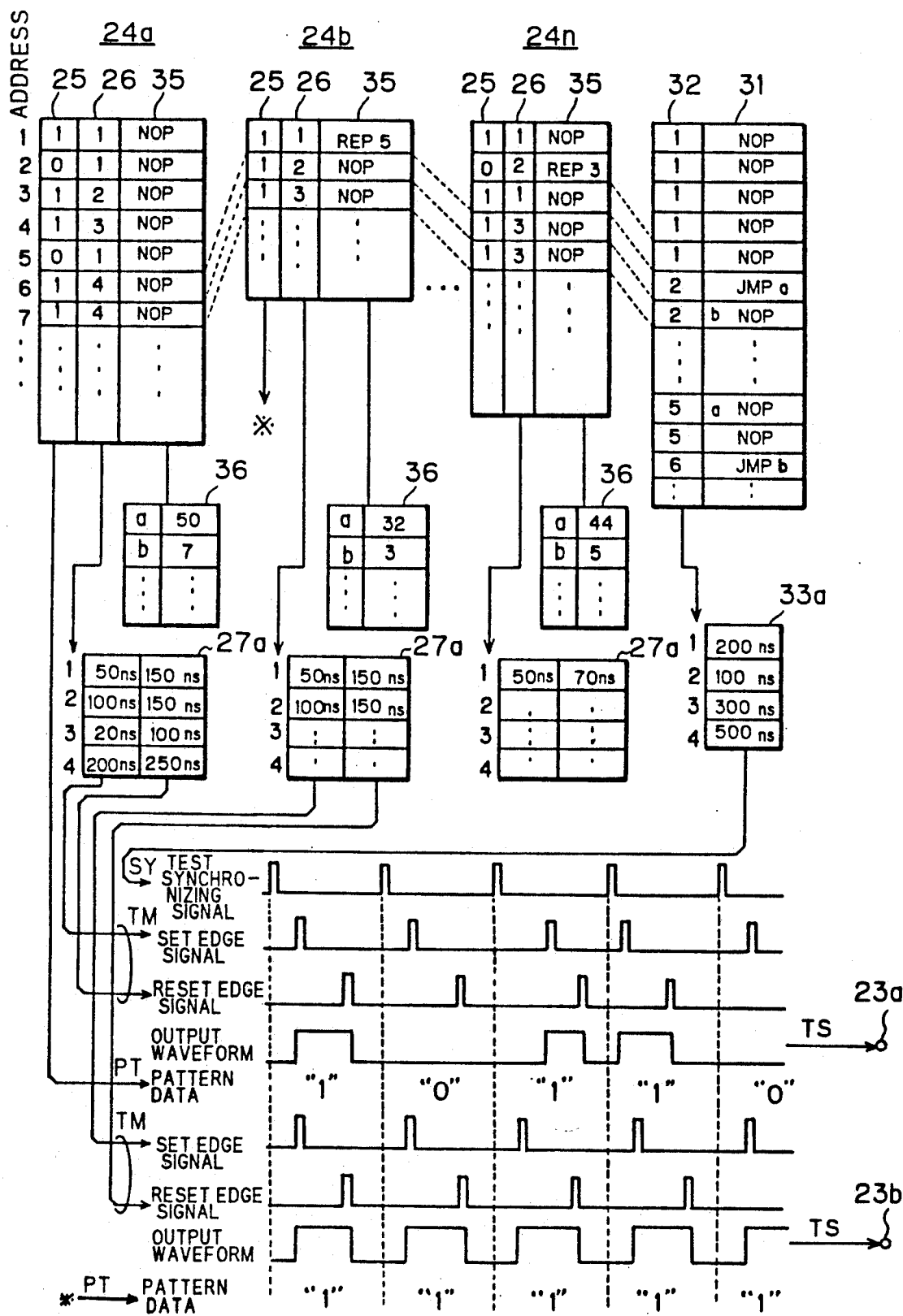
FIG. 2 explains the operation of the device shown in FIG. 1.

Next, an operation of the device is explained, referring to FIG. 2. A test program produced by the CPU 21 is transmitted through the CPU bus 22 to the pattern memories 25, the timing memories 26, the pin instruction memories 35 and the label correspondence memories 36, which are provided separately for each of the pin test portions 24a, 24b, ... 24n, and also to the main instruction memory 31 and the period memory 32, which are common to all of the pin test portions 24a, 24b, ... 24n, to be stored therein.

Figure 4:
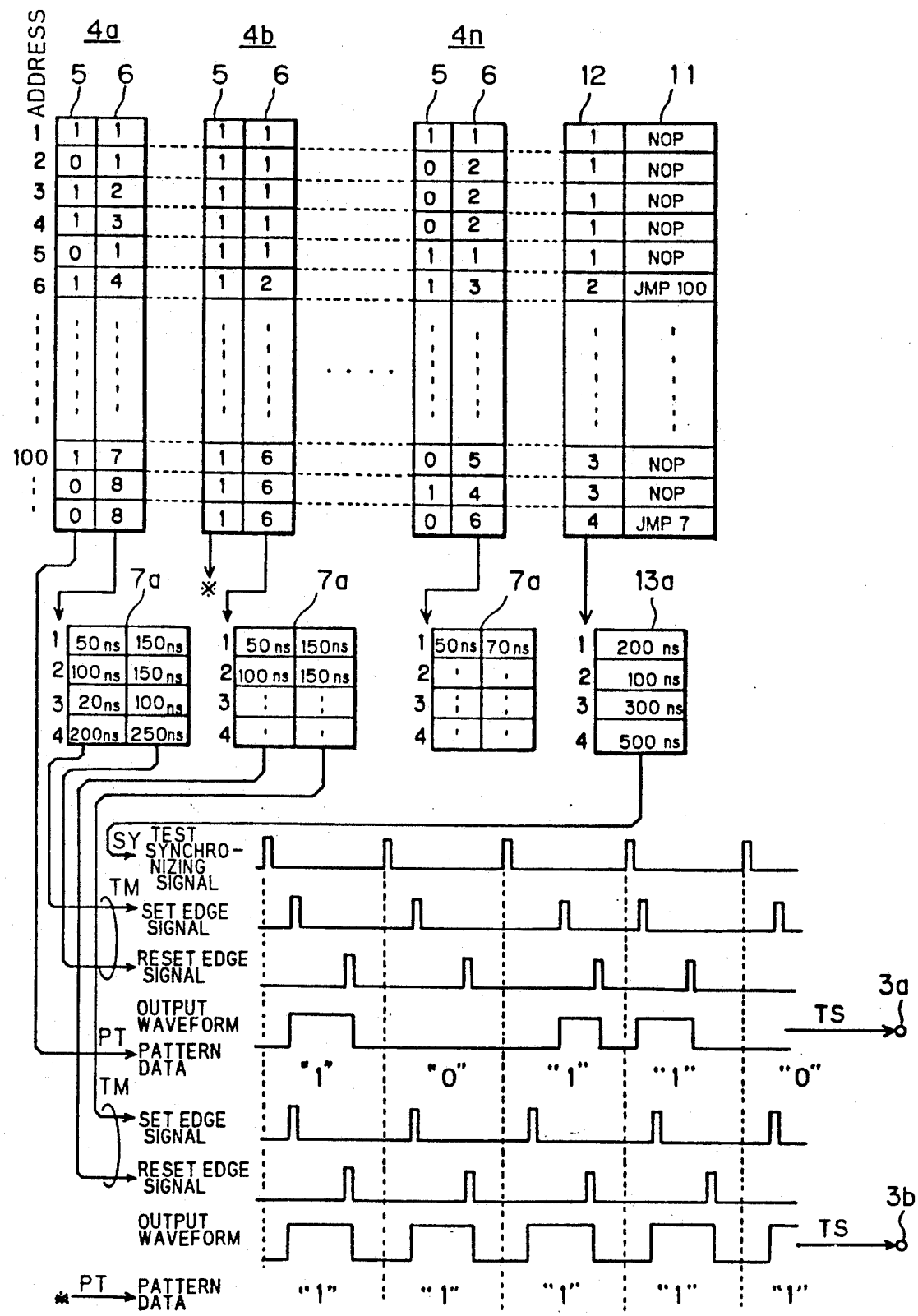
FIG. 4 explains the operation of the device shown in FIG. 3.

As shown in FIG. 2, the contents of the pattern memories 25 have a value "0" or "1", those of the timing memories 26 have a value indicating an address of a timing edge data table 27a in the timing generator 27, similarly to the prior art. Differently from the prior art, however, the contents of the pattern memories 25 and the timing memories 26 are in a compressed form for each of the pin test portions 24a, 24b, ... 24n. For example, the first five addresses of the pattern memory 5 and timing memory 6 in the pin test portion 4b shown in FIG. 4 correspond to the first one addresses of the pattern memory 25 and timing memory 26 in the pin test portion 24b according to the preferred embodiment shown in FIG. 2. There is a description of an instruction "REP5" at the first address of the pin instruction memory 35 in the pin test portion 24b. According to the instruction, the first addresses of the pattern memory 25 and timing memory 26 are accessed five times repeatedly. Thus, in addition to the reduction of the memory capacity of the pattern memory 25 and timing memory 26 in each of the pin test portions 24a, 24b, ... 24n, the volume of the test programs is reduced, thereby the test programs are easily managed.

The contents of the period memory 32, similarly to the prior art, have a value indicating an address of a test synchronizing signal timing data table 33a in the test synchronizing signal generator 33. Differently from the prior art, among the main instructions stored in the main instruction memory 31, some of them related to the control common to all of the pin test portions 24a, 24b, ... 24n are labelled. For example, there is a description of a main instruction "JMPa" at the sixth address of the main instruction memory 31 in FIG. 2, where "a" corresponds to a label.

At the start of the test operation, the CPU 21 transmits a test start command to the pin pattern controllers 34 provided in each of the pin test portions 24a, 24b, .. . 24n and the main pattern controller 30 which is common to all of the pin test portions 24a, 24b, ... 24n. Each of the pin pattern controllers 34 responds to the test start command and transmits a start address to the pattern memory 25, timing memory 26 and pin instruction memory 35 in the same pin test portion in synchronism with the test synchronizing signal SY. The contents of the memories 25, 26 and 35 are read out according to the supplied address. The pin pattern controller 34 determines the next address in accordance with the contents of the data read out from the pin instruction memory 35, and transmits it to the memories 25, 26 and 35 in synchronism with the next test synchronizing signal SY. Subsequently, the pin pattern controller 34 transmits the addresses determined in accordance with the contents of the pin instruction memory 35 to the memories 25, 26 and 35.

On the other hand, the main pattern controller 30 responds to the test start command supplied from the CPU 21 and transmits a start address to the main instruction memory 31 and the period memory 32 in synchronism with the test synchronizing signal SY. The contents of the memories 31 and 32 are read out in accordance with the supplied address. The main pattern controller 30 determines the next address in accordance with the contents of the data read out from the main instruction memory 31, and transmits it to the memories 31 and 32 in synchronism with the next test synchronizing signal SY. Subsequently, the main pattern controller 30 transmits the addresses determined in accordance with the main instruction memory 31 to the memories 31 and 32.

In the case where a main instruction of an address is related to the control common to all of the pin test portions 24a, 24b, ... 24n, such as the sixth address of the main instruction memory 31 in FIG. 2, a label ("a" at the sixth address) is attached to the main instruction. The main pattern controller 30, for example, while using the address "a" as a next designation address to the main instruction memory 31 and period memory 32 in response to the content "JMPa" at the sixth address, transmits the label data LB of "a" to the pin pattern controllers 34 in each of the pin test portions 24a, 24b, ... 24n. Each of the pin pattern controllers 34, by accessing the address "a" of the label correspondence memory 36, obtains a next designation address to the pattern memory 25, timing memory 26 and pin instruction memory 35. For example, with respect to "a" of the label data LB, the next designation address in the pin test portion 24a is "50" and that in the pin test portion 24b is "32". Thus, in the test program including repetitions or subroutines through all of the pin test portions 24a, 24b, . . . 24n, the main instruction can control the pin pattern controllers 34 in each of the pin test portions 24a, 24b, . . . 24n as well as the main pattern controller 30. Thereby, the volume of the test programs is further reduced, and the test programs can be produced and managed more easily.

The data which is read out from the period memory 32 (or the address value of the test synchronizing signal timing data table 33a in the test synchronizing signal generator 33 as described above) is supplied to the test synchronizing signal generator 33. The test synchronizing signal generator 33 accesses the test synchronizing signal timing data table 33a in accordance with the supplied address value to determine the period of the test synchronizing signal SY to be generated. The test synchronizing signal SY with the determined period is generated in the test synchronizing signal generator 33 and is supplied to the main pattern controller 30 and the pin pattern controllers 34 and timing generators 27 in each of the pin test portions 24a, 24b, . . . 24n.

In each of the pin test portions 24a, 24b, . . . 24n, the data which is read out from the timing memory 26 (or the address value of the timing edge data table 27a in the timing generator 27 as described above) is supplied to the timing generator 27. The timing generator 27 accesses the timing edge data table 27a in accordance with the supplied address value to determine the timing of the test signal TS to be generated (and the timing of executing the judgement not shown in FIG. 2). The timing signal (or set edge and reset edge signals in FIG. 2) TM with the determined timing is generated in the timing generator 27 and is supplied to the output waveform generation circuit 28 and the comparator 29.

The pattern data PT which is read out from the pattern memory 25 in the same pin test portion is also supplied to the output waveform generation circuit 28. The output waveform generation circuit 28 generates an output waveform in accordance with the supplied pattern data PT and timing signal TM and outputs it as a test signal TS to the corresponding external signal terminal 23a, 23b, . . . 23n. The outputted test signal is inputted to the semiconductor device 400 to be tested through the pin thereof which is connected to the corresponding external signal terminal 23a, 23b, . . . 23n.

On the other hand, though not shown in FIG. 2, a response output from the semiconductor device 400 to be tested is inputted to the comparator 29 in each of the pin test portions 24a, 24b, . . . 24n through the external signal terminal 23a, 23b, . . . 23n. The comparator 29 samples the response output in the timing of the timing signal TM outputted from the timing generator 27 and compares the sampled data with the pattern data PT (or the expected value) outputted from the pattern memory 25, thereby whether or not the response output is correct is judged.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A device for testing a semiconductor device having a plurality of pins, comprising:
   a plurality of external signal terminals to be connected to said pins; and
   a plurality of pin test portions provided correspondingly to said external signal terminals, respectively,
   each of said pin test portions comprising:
      first storing means for storing first data on logical patterns of a test signal to be applied through a corresponding one of said external signal terminals to a corresponding one of said pins to which the external signal terminal is connected;
      second storing means for storing second data on timings in which said test signal is applied;
      control means for controlling readout of said first and second data from said first and second storing means;
      third storing means for storing programs which specify an operation process of said control means; and
      signal generating means for generating said test signal on the basis of said first and second data which are read out from said first and second storing means to apply it to a corresponding one of said external signal terminals.

2. A device for testing a semiconductor device in accordance with claim 1, further comprising
   common control means for controlling functions in relation to all of said pin test portions, and
   fourth storing means for storing programs which define an operation procedure of said common control means.

3. A device for testing a semiconductor device in accordance with claim 2, wherein
   said programs of said fourth storing means include a labelled instruction which is related to a control common to all of said pin test portions,
   said common control means transmitting label data to each of said pin test portions in response to said labelled instruction,
   each of said pin test portions further comrpising fifth storing means for storing a table indicating correspondence between contents of said label data and specific addresses of said third storing means,
   said control means accessing said fifth storing means in response to said label data transmitted from said common control means to obtain an address corresponding to said label data to operate in accordance with a content in said address obtained of said third storing means.

4. A device for testing a semiconductor device in accordance with claim 2, further comprising
   sixth storing means for storing period data which define a period of a test synchronizing signal for synchronizing each of said pin test portions with each other and for outputting said period data under control of said common control means, and
   a test synchronizing signal generator for generating said test synchronizing signal in accordance with said period data output from said sixth storing means.

5. A device for testing a semiconductor device in accordance with claim 1, wherein
   said first storing means also stores third data on logical patterns of judgment, and
   said second storing means also stores fourth data on timings of performing said judgment,
   each of said pin test portions further comprising judging means for judging correctness of a response output signal applied form said semiconductor device through a corresponding one of said external signal terminals on the basis of said third and fourth data which are read out from said first and second storing means.

6. A device for testing a semiconductor device in accordance with claim 5, wherein
each of said pin test portions further comprising a timing generator for generating a timing signal on the basis of said second and fourth data read out from said second storing means.

7. A device for testing a semiconductor device in accordance with claim 6, wherein
said signal generating means includes an output waveform generation circuit for generating an output waveform on the basis of said first data read out from said frist storing means and said timing signal generated by said timing generator to output it as said test signal.

8. A device for testing a semiconductor device in accordance with claim 7, wherein
said judging means includes a comparator for sampling said response output signal in timing of said timing signal output from said timing generator to make a judgment by comparing said response output signal as sampled with said third data output from said first storing means.

* * * * *